United States Patent [19]

Asmus et al.

[11] Patent Number: 4,889,605
[45] Date of Patent: Dec. 26, 1989

[54] PLASMA PINCH SYSTEM

[75] Inventors: John F. Asmus, La Jolla; Ralph H. Lovberg, San Diego, both of Calif.

[73] Assignee: The Regents of the University of California, Berkeley, Calif.

[21] Appl. No.: 129,152

[22] Filed: Dec. 7, 1987

[51] Int. Cl.$^4$ ................................................ H01S 3/09
[52] U.S. Cl. .................... 204/157.44; 148/DIG. 45; 118/723; 372/76; 378/34; 204/157.63; 204/192.25; 156/345
[58] Field of Search ................... 148/DIG. 46, 51, 45, 148/71, 93, 131; 156/643, 646; 427/35, 36, 38, 39, 53.1, 54.1; 29/569.1; 437/17–19, 173, 225, 930, 936, 937, 942, 963; 372/76, 85; 204/157.44, 157.63, 192.12, 192.25; 118/50.1, 723; 378/34, 35, 83, 119, 121

[56] References Cited

U.S. PATENT DOCUMENTS

| | | | |
|---|---|---|---|
| 3,946,382 | 3/1976 | Samis | 372/85 |
| 4,007,430 | 2/1977 | Fletcher et al. | 372/76 |
| 4,088,966 | 5/1978 | Samis | 372/85 |
| 4,369,514 | 1/1983 | Silfvast et al. | 372/76 |
| 4,450,568 | 5/1984 | Asmus | 372/76 |
| 4,454,835 | 6/1984 | Walsh et al. | 118/723 |
| 4,525,381 | 6/1985 | Tanaka et al. | 427/54.1 |
| 4,525,382 | 6/1985 | Sugioka | 427/54.1 |
| 4,635,282 | 1/1987 | Okada et al. | 378/34 |
| 4,641,316 | 2/1987 | Collins et al. | 372/76 |

Primary Examiner—Brian E. Hearn
Assistant Examiner—William Bunch
Attorney, Agent, or Firm—Bernard L. Kleinke; Jerry R. Potts; William P. Waters

[57] ABSTRACT

A plasma pinch system includes a fluid-jet pinch device for establishing a plasma source composed of a tenuous vapor preconditioning cloud surrounding a central narrow flowing fine stream of fluid under pressure. A discharge device is connected electrically to the fluid-jet pinch device for supplying an electrical flow through a portion of the fluid stream for establishing an incoherent light emitting plasma therealong. A method of using the plamsa pinch system for manufacturing semiconductors, includes exposing a semiconductor wafer to the incoherent light emitted by the plasma for either annealing or etching purposes.

12 Claims, 8 Drawing Sheets

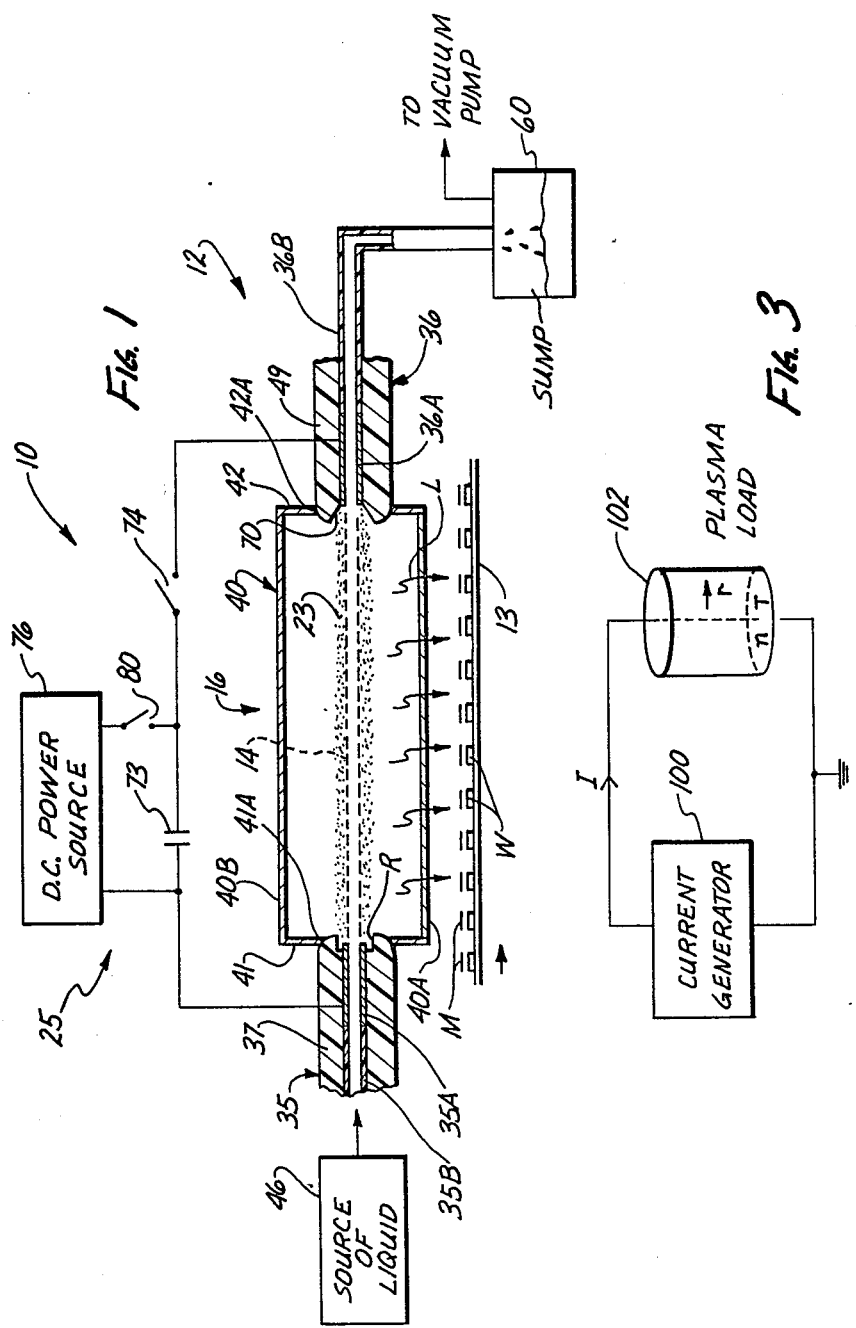

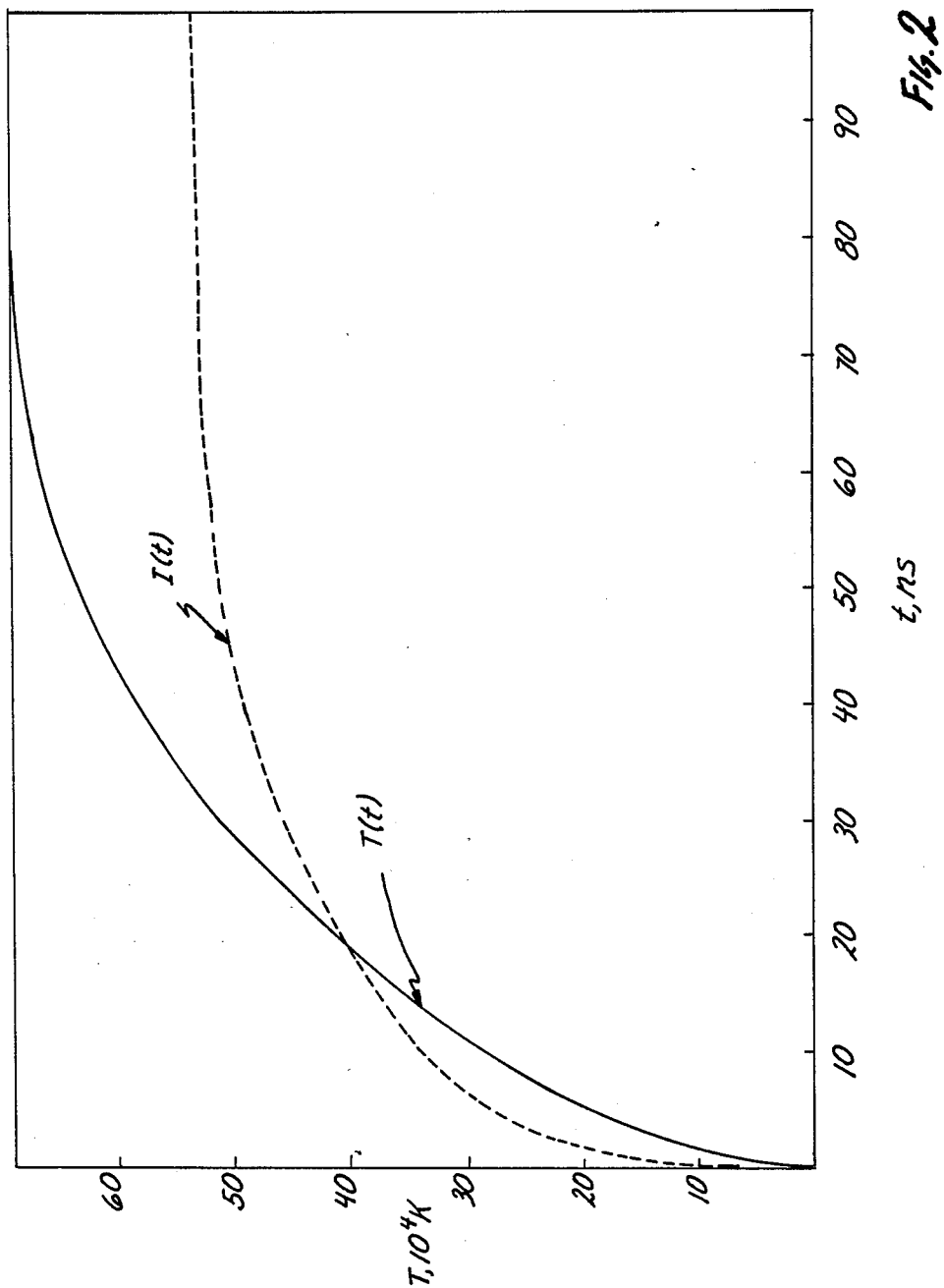

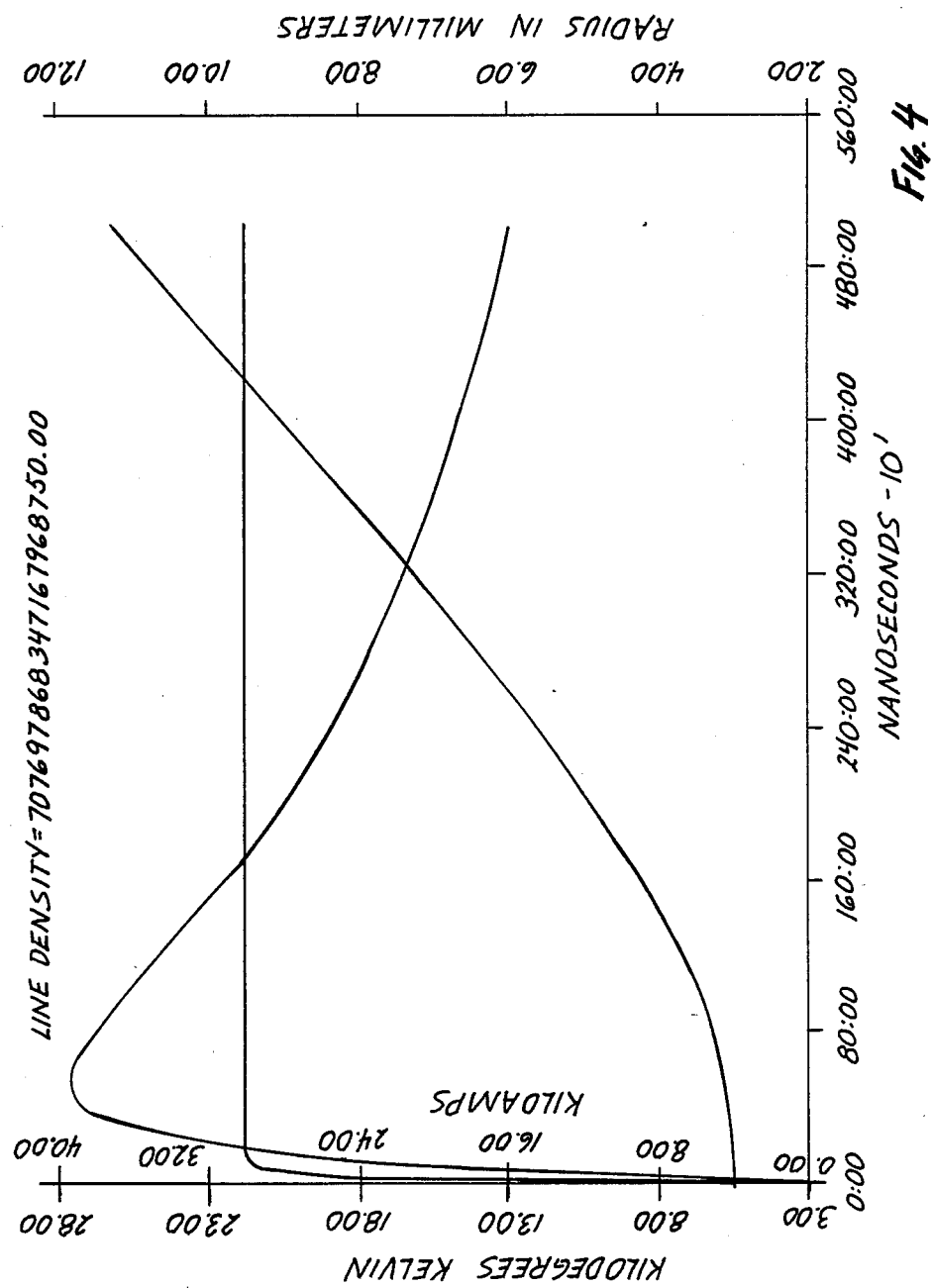

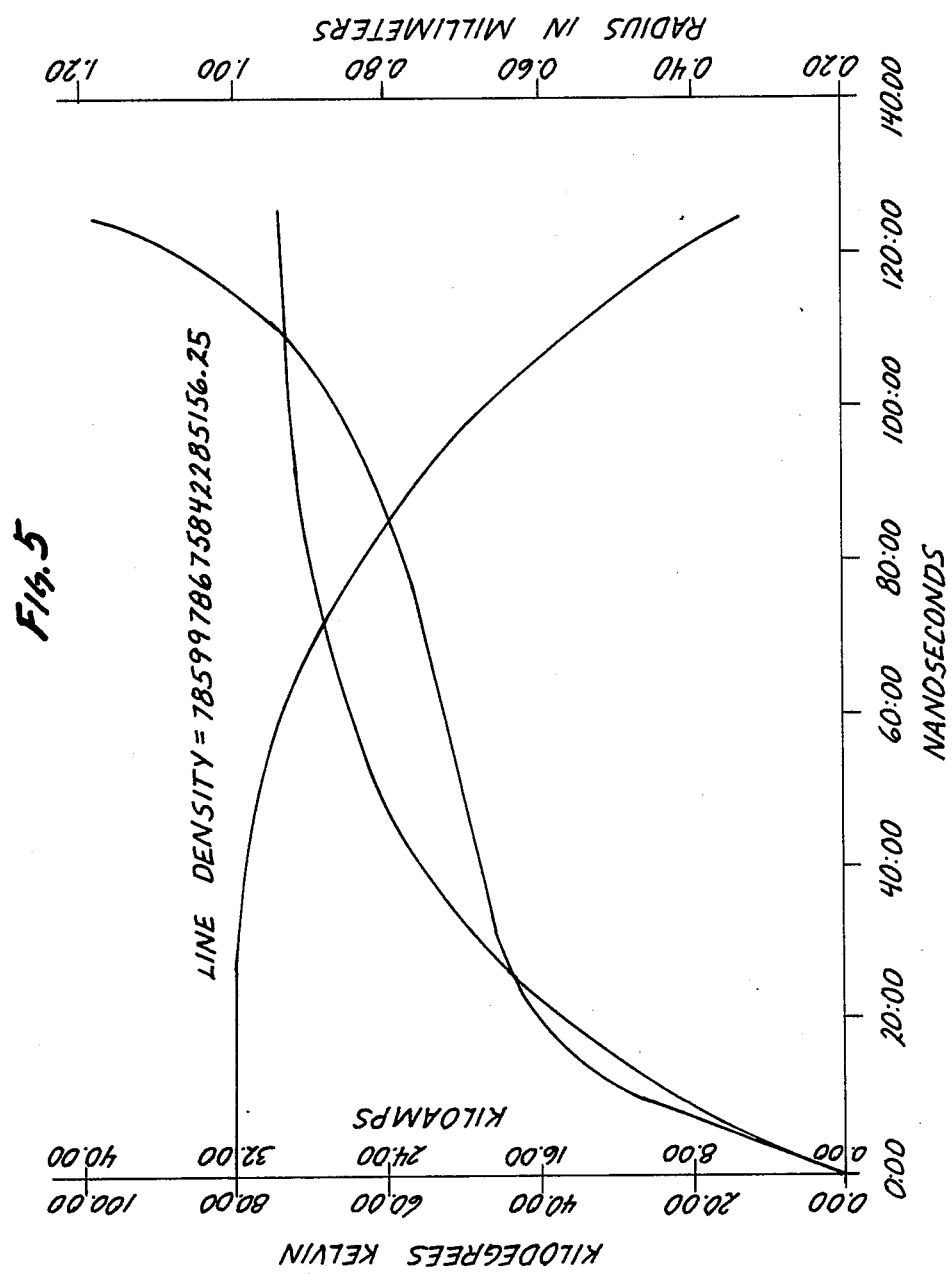

PLASMA PINCH SYSTEM

DESCRIPTION

This invention was made with Government support under Contract No. N00014-85-K-0598 awarded by the Office of Naval Research. The Government has certain rights in this invention.

1. Technical Field

The present invention relates in general to plasma pinch systems, and it more particularly relates to a plasma pinch system for use in annealing and etching semiconductor circuitry.

2. Background Art

In the past, there has been several problems associated with the manufacturing processes for integrated circuits and semiconductor chips. For instance, the conventional use of laser beams for annealing semiconductor substrates has proven to be a relatively costly and complex process, and otherwise less than satisfactory. In this regard, trained and skilled personnel are required to operate the expensive laser equipment. A much more serious problem relates to the use of overlapping laser beams, for annealing purposes. Such techniques have tended to cause a non-uniform annealing of the substrates. In this regard, certain areas of the substrates receive a relatively excessive flux of energy.

In general, the use of a coherent light beam, such as a conventional laser beam, is subject to diffraction, which further reduces the performance of the annealing process. Additionally, an overly extended exposure to the laser beam can cause micro-cracks or micro-crystalline damage to the substrate. Thus, the conventional annealing processes do not produce entirely satisfactory results for some applications. In this regard, the resulting products are oftentimes defective, and an undesirably high reject rate does occur all too frequently. Thus, known processes frequently produce unwanted side affects, are relatively time consuming, and are costly due to the large number of rejects.

Therefore, there is a need for a process and equipment which prevent, or at least greatly eliminate the unwanted side affects. Such a new technique should be relatively efficient and expedient.

Conventional semiconductor etching techniques generally include exposing a photoresist-coated substrate to an impinging light beam. However, with the ever increasing miniaturization of the semiconductor integrated circuitry, the size of circuit details are becoming so small that they are of a similar order of magnitude as the size of the wavelength of the impinging light beam itself. Thus, the impinging light becomes diffracted, and irregularities in the resulting product can occur.

Furthermore, due to the relatively low intensity of nonlaser sources of impinging light, the required exposure time is extended so as to convey the necessary energy for use in the etching process. Thus, the etching process is not only delayed, but the risk of impurities infiltration is increased substantially.

Therefore, there is a need for an incoherent light source and a method of using it, which not only improves the annealing operations, but which further render the semiconductor etching processes compatible with modern techniques. In this regard, the undesirable diffraction caused by impinging coherent light beams would be greatly reduced, if not minimized.

Several attempts have been made to utilize incoherent light source devices for annealing and etching semiconductor elements. For example, a surface spark technique has been attempted as a source of incoherent light source. However, the non-uniformity of results, was a serious problem. Also, the source did not achieve sufficiently high temperatures for efficient light generation due to problems associated with expansion of the resulting plasma. Thus, such a technique had only limited usefulness in modern semiconductor manufacturing.

Another prior incoherent light source technique attempted was the use of an exploding wire. This technique employed a high current flow in a conductor to cause it to explode, thereby providing the incoherent light. One serious drawback of the exploding wire technique was its slower repetition rate, in that the wires must be replaced after each firing. Also, the system did not produce uniform results.

Yet another attempt at producing an incoherent light source for the semiconductor industry, was an approach known as a plasma focus system. This system employed a plasma, which was subjected to a magnetic field for producing a plasma jet. The jet emitted the incoherent light. However, such technique was not totally satisfactory, in that the device did not reach sufficiently high temperatures for semiconductor manufacturing processes. Also, an inadequate quantity of ultraviolet light was produced for use in semiconductor etching or annealing processes.

Therefore, it would be highly desirable to have a new and improved incoherent light source for the manufacture of semiconductors, and more particularly, it would be highly desirable to have a new plasma system, which is adaptable for use as a source of incoherent and stable light energy. The plasma system should produce sufficient energy for use in the etching and annealing operations in the semiconductor industry. The system should also be amenable to cost effective use in the modern mass production sequences of semiconductor circuitry. The system should be operable at relatively low and thus safer voltages. It must be properly focusable, and it must be able to be pulsed at a sufficiently high rate of speed to be useful in the semiconductor industry.

There are, however, several other formidable problems associated with the use of a plasma as an incoherent light source in the manufacture of semiconductors, due to the nature of an ionized plasma. Unlike a metal or an electrolyte, a gas free from external influences contains no free charges to serve as carriers of an electrical current. However, gases may be rendered conductive by generally causing some of the molecules to become ionized by the detachment of one or more of their outer electrons. Some of these detached electrons may then attach themselves to neutral molecules, to form negative ions, such that in an ionized gas, both positive and negative ions, as well as free electrons are usually present. When the concentrations of the positive and negative ions become appreciable, the ionized gas is generally referred to as "plasma".

In most applications, utilizing a high-temperature plasma, such as in a thermonuclear fusion reactor, the plasma is required to be confined within a suitable container or chamber, away from its walls. Such confinement of the plasma has been achieved by various techniques, which are generally referred collectively to as a "plasma pinch".

Plasma pinch systems have been employed for various applications. For instance, U.S. Pat. No. 4,042,848 describes a hypocyclodial pinch device for producing a dense plasma at thermonuclear fusion temperatures. U.S. Pat. No. 4,406,952 describes a switch for interrupting current using a plasma focus device.

In U.S. Pat. No. 4,450,568, there is disclosed a laser preconditioned plasma pinch, which emits vacuum ultraviolet radiation, for dissociating the molecules of a photolytic laser medium confined in a chamber. The preconditioning laser beam excites the gas particles in the vicinity of the chamber axis, for defining a preconditioned channel within which the plasma pinch is formed.

U.S. Pat. No. 4,543,231 describes a plasma pinch used in fusion devices to produce a toroidal plasma. In U.S. Pat. No. 4,621,577, there is disclosed a plasma pinch formed by a discharge between electrodes, used for detonating explosives.

Another major application of the plasma pinch, is its use in X-ray lithography. For example, in U.S. Pat. No. 4,424,102, a plasma pinch is disclosed and is used for reactive ion etching of semiconductor substrates. The etching process includes the use of magnetic fields in connection with the plasma pinch. U.S. Pat. Nos. 4,504,964; 4,536,884; 4,618,971; 4,633,492; and 4,635,282 also disclose various plasma pinch systems usable in X-ray lithography, whereby X-rays are generated by passing a high current through the plasma.

However, none of the prior known plasma pinch systems have been entirely satisfactory for use in etching and annealing semiconductors.

DISCLOSURE OF INVENTION

Therefore, it is an object of the present invention to provide a new and improved plasma pinch system for use in the etching and annealing operations in the semiconductor industry.

It is another object of the present invention to provide a new and improved plasma pinch system which is amenable to cost effective use in the modern mass production sequence of semiconductor circuitry.

It is yet another object of the present invention to provide a new and improved plasma pinch device which is operable at relatively low voltages and is able to be pulsed for use in the manufacture of semiconductors.

Briefly, the above and further objects and features of the present invention are realized by providing a new and improved plasma pinch system which includes a fluid-jet plasma pinch device, which provides a plasma source composed of a tenuous vapor preconditioning cloud surrounding a central narrow flowing fine stream of fluid under pressure. A discharge-device is connected electrically to the fluid-jet pinch device for establishing an electrical current flow through the fluid jet between a pair of metal electrodes for establishing a plasma between the electrodes. A method of using the plasma pinch system for annealing or etching operation, includes exposing a semiconductor wafer to the high energy radiation emitted by the pinched plasma and collected by a system of lenses and/or reflectors.

The use of a fluid stream under pressure that is surrounded by a preconditioning vapor sheath for the plasma pinch formation, produces a highly stable plasma, which is suitable for use in the annealing and etching of semiconductors.

The plasma resulting from the use of the vapor-sheath-stabilized liquid-stream technique of the present invention, is uniform and stable, and it radiates energy of sufficient intensity for use in modern semiconductor annealing and etching operations. Moreover, the light beam radiated by the present system is incoherent, and therefore, the efficiency of the semiconductor annealing and etching processes is greatly improved, since the diffraction problems are eliminated, or greatly reduced. Additionally, the relatively high energy intensity of the emitted light, causes the exposure time of the semiconductor wafer to be reduced, and thus to reduce greatly or to minimize the possibility of impurity implantation therein. The present inventive plasma pinch system is operable at relatively low voltages and high radiative efficiencies, thus expanding its scope of application, by reducing insulator deteriorization, and thus the danger associated with its use.

In the preferred form of the invention, the stream of fluid is a certain liquid, such as decane. In another form of the invention, the liquid is pentane. In yet another form, the stream of liquid is water.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 1 is a diagrammatic view of a portion of a semiconductor manufacturing process of the present invention, and employs a plasma pinch system, which is constructed in accordance with the present invention;

FIG. 2 is a graphical representation of the numeral solution for a gas-embedded pinch formation of the present invention;

FIG. 3 is a simplified circuit diagram for a kinetic pinch model of the present invention;

FIG. 4 is a graphical representation of the computed behavior of a 3 mm plasma pinch in argon at about 1 atmosphere;

FIG. 5 is a graphical representation of the computed behavior of a 1 mm plasma pinch in argon at about 0.1 atmosphere;

BEST MODE FOR CARRYING OUT THE INVENTION

Figure 6:
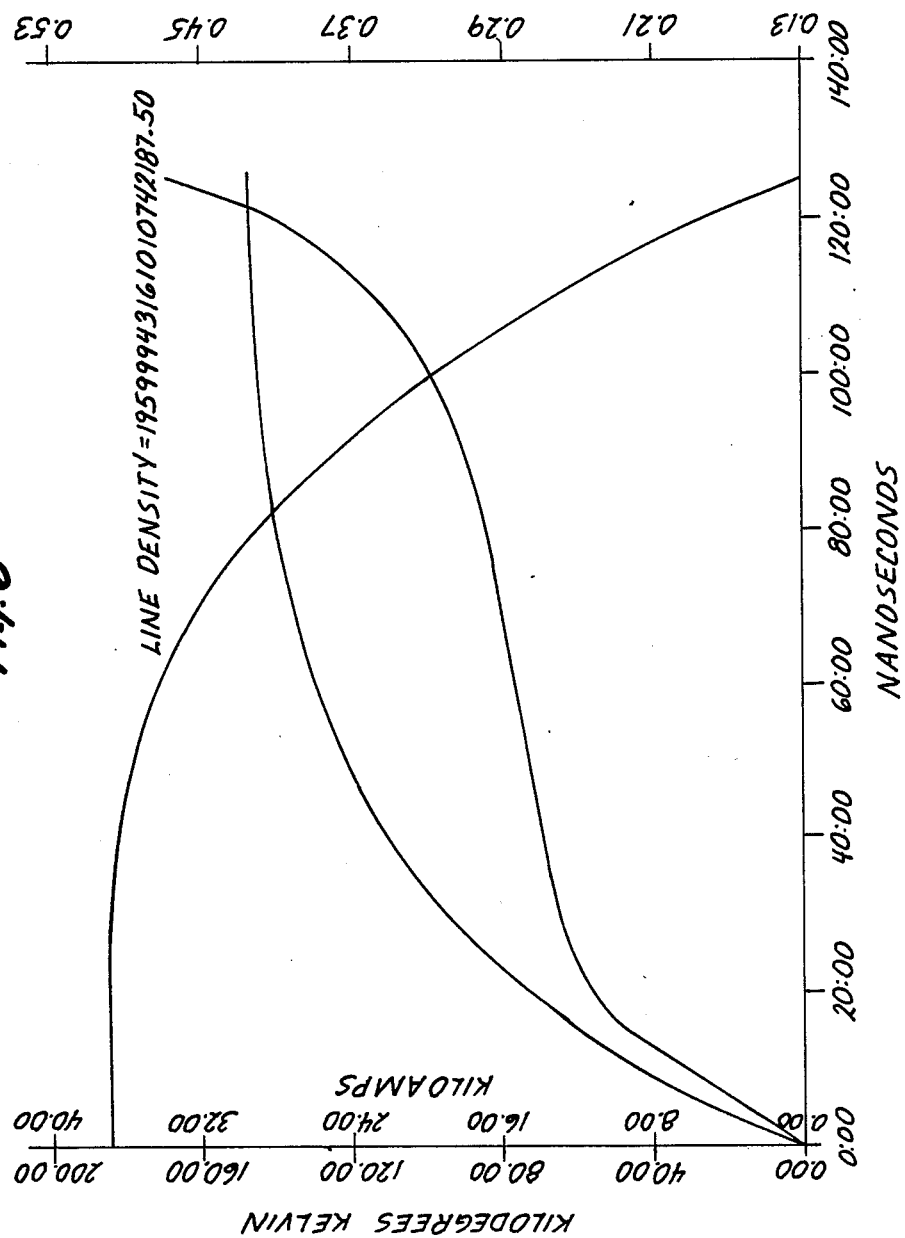
FIG. 6 is a graphical representation of the computed behavior of a 0.5 mm plasma pinch in argon at about 0.1 atmosphere.
Figure 7:
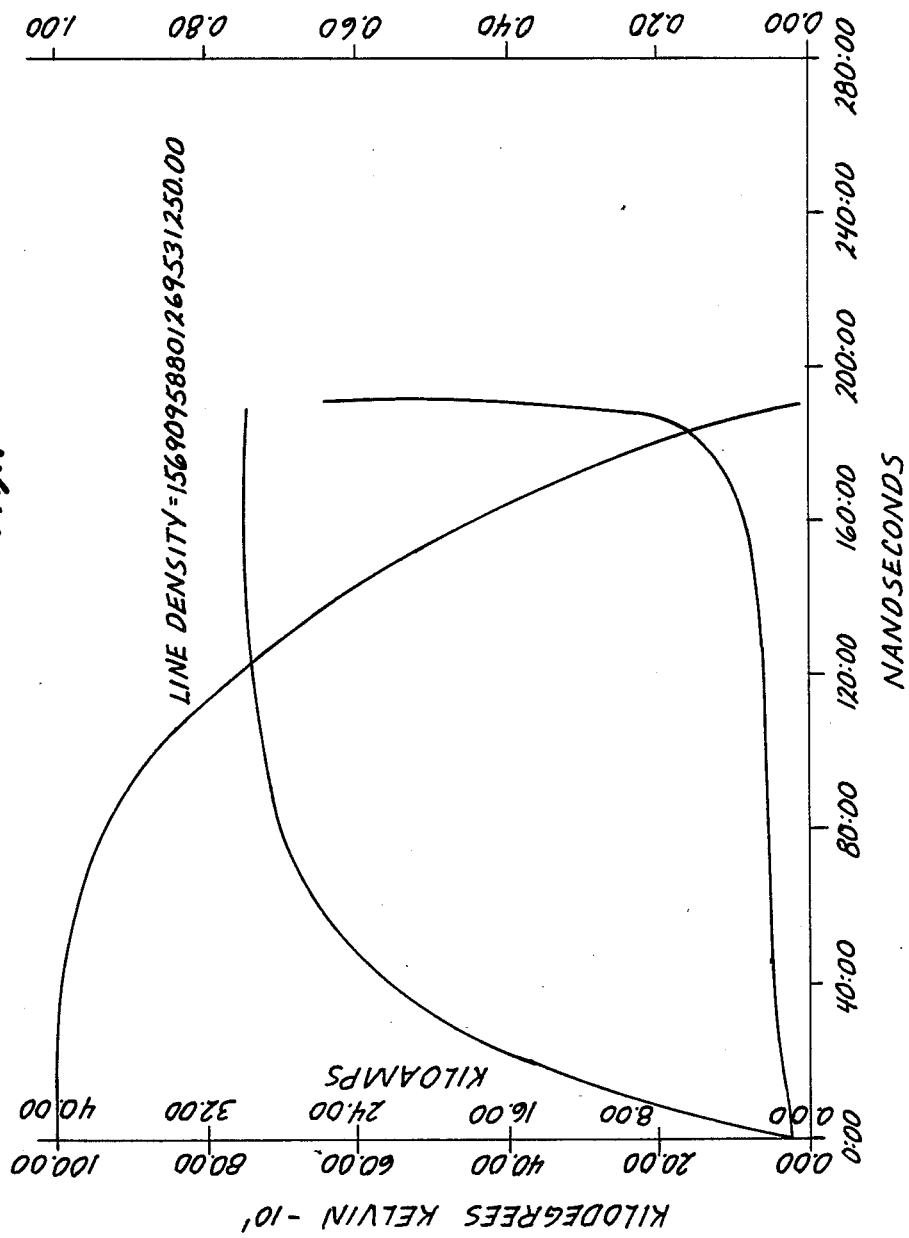
FIG. 7 is a graphical representation of the computed behavior of a 1 mm plasma pinch in argon at about 0.2 atmosphere.

Referring now to FIG. 1, there is illustrated a plasma pinch system 10 which is constructed in accordance with the present invention, and which is adapted for use in an invention process for manufacturing semiconductor wafers, such as the wafers W carried by a conveyor belt 13 past the system 10. The illustrated and described process is an etching process, employing a series of conventional etching masks M having a desired circuit configuration thereon, interposed between the system 10 and the conveyor belt 13. In this regard, the plasma system 10 emits light L (especially ultraviolet light)

which is directed toward the wafers W and the masks M interposed between the plasma system 10 and individual ones of the wafers W, for serving as a portion of an etching process for the manufacture of semiconductor chips resulting from the etching process performed on the wafers W. The remaining portions of the etching process are conventional and are not described herein.

The inventive semiconductor manufacturing process employing the ultraviolet light emitting plasma system 10, can also be utilized in the annealing stage of the manufacture of semiconductor chips (not shown). In this regard, the process is similar to the etching process illustrated in FIG. 1, except that the masks M are not employed. Instead, light emitted from the system 10 floods directly onto the wafers W for annealing purposes. Thus, the inventive semiconductor manufacturing process employs the light emitting plasma system 10 for both etching and annealing portions of the production of semiconductor chips.

Considering now the plasma system 10 generally includes a plasma source fluid-jet pinch device 12, to establish a central narrow preconditioned fluid channel which is generally illustrated in broken lines at 14, for the plasma to be formed and pinched therealong, within a limited volume of a closed chamber 16. The fluid channel 14 is initially in the form of a stream of a liquid which flows under pressure through the chamber 16 that is kept at vacuum through the action of a vacuum pump (not shown). A vapor cloud 23 surrounds the liquid stream, and cooperates therewith to form the main pre-ionizing driver of the plasma system 10. An electrical discharge device generally indicated at 25 includes a pair of spaced-apart electrode assemblies 35 and 36 at opposite ends of the chamber 16, for directing the stream of liquid through the chamber 16 and for establishing an electrical current flow through the preconditioning vapor cloud 23 of liquid along the channel 14 to establish the plasma.

In operation, a fine stream of liquid flows under pressure between the electrode assembly 35 and 36 inside the chamber 16. The discharge system 25 is thereafter activated for delivering a potential of approximately 30,000 volts across the electrodes 35 and 36 to cause an electrical current initially through the vapor cloud 23. The stream absorbs the energy emanating from the low-density plasma 23, and is in turn radiatively heated. The liquid stream then becomes ionized, and is transformed into a high-Z dense plasma. The generated plasma then conducts the continuing discharge electrical current, and produces high-intensity ultraviolet light. The generated dense pinched plasma diverts most of the discharge electrical current from the surrounding low-density plasma, and conducts it along the channel 14 through the chamber 16. The resulting plasma is substantially stable, and is substantially uniform in cross section throughout its length.

The pinched plasma generates an ultraviolet light of sufficient intensity to anneal or etch the semiconductor wafers W. For this purpose, it is desirable to generate recurring discharge pulses by the device 25 at a rate of about 1-10 pulses per second. Thus, the plasma becomes extinguished and then is re-established repeatedly by the device 25. In this regard, the foregoing steps of the process are repeated each time for re-establishing the plasma pinch in a recurring manner.

Considering now the chamber 16 in greater detail with reference to FIG. 1, it generally includes an elongated tubular shell or housing 40, which is hollow throughout its entire axial length, and which is substantially uniform in cross sectional shape. The cross-sectional shape may be circular, oval, or elliptical.

The housing 40 is substantially closed at both of its ends by two end walls 41 and 42, each of which having respective central openings 41A and 42A for receiving the front portions of the electrode assemblies 35 and 36 which are sealed thereto. The housing 40 includes a bottom wall portion 40A, which is preferably made of quartz, sapphire, glass, or other suitable transparent material, to permit the light L to pass therethrough. However, it should be understood that the bottom wall portion can alternatively be made of other suitable transparent material. The end walls 41 and 42, and a remaining upper wall portion 40B may include opaque or reflective inner surfaces. Alternatively, the wafers may be placed inside chamber 40 so that no window need be employed. In this manner window absorption of vacuum ultraviolet radiation may be completely avoided.

Considering now the fluid-jet device 12 in greater detail, it generally includes a preconditioning source 46 of liquid under pressure, for supplying the stream of liquid to the interior of the chamber. A plastic tube 35B is disposed with a central bore of an electrode 37 of the electrode assembly 35 and is connected in fluid communication with the source 46 of liquid under pressure. A metal electrode tube 35A is co-axially aligned with the plastic delivery tube 35B, to cooperate with a recess R in the electrode 37 to form an inlet nozzle; to permit fluid communication between the tube 35B and the interior of the chamber 16. The tube 35A is connected electrically to a discharge capacitor 73 of the discharge device 25. The stream of liquid under pressure flows longitudinally within the chamber 16 as a fine (100 $\mu$m diameter), substantially narrow, straight and focused stream, and causes the annulus of surrounding vapor cloud 23 to be formed thereabout.

In the preferred form of the invention, the liquid stream is preferably decane. However, it will become apparent to those skilled in the art that pentane or water can be used alternatively. Liquid metals such as mercury or gallium may also be employed.

The liquid stream exits the chamber 16 through the electrode assembly 36, via a metal tube 36A disposed centrally in a bore of an electrode 49 of the electrode assembly 36 in a similar manner as the metal tube 35A and the plastic tube 35B of the electrode assembly 35. A plastic outlet tube 36B, axially aligned with the metal tube 36A, directs the received liquid of the stream to a sump 60 for disposal purposes. The metal tube 36A is connected electrically through a switch 74 to the other terminal of the capacitor 73, the switch 74 being one that opens and closes periodically. Alternatively, the liquid jet itself may act as the switch as electrical current may flow whenever the stream spans the entire gap between electrode assemblies 35 and 36. Thus, the liquid jet may be pulsed, periodically. In this regard, the metal tubes 35A and 36A are disposed in confronting alignment and are oppositely spaced apart in co-axial alignment, with one another to cause substantially most of the liquid particles of the stream 22 to be captured by the electrode assembly 36.

For the purpose of causing the liquid stream to enter the chamber 16 at a substantially high velocity, the liquid flows in a fine and narrow stream, and it is caused to flow through the chamber 16 under pressure.

The electrode assembly 36 generally includes a funnel-shaped outwardly tapered entranceway 70 to form with the electrode 49 an outlet collector to help guide the liquid stream into the entrance end of the metal tube 36A of the electrode assembly 36.

The discharge system 25 is connected to the fluid-jet pinch device 12 through the electrode assemblies 35 and 36, and in this regard, the electrode assemblies 35 and 36 serve a dual function, as both channels for the fluid flow, as well as discharge devices. The electrode bodies 37 and 49 of the respective electrode assemblies 35 and 36 are composed of a suitable non-corrosive conductive material such as brass, stainless steel, Mallory metal, or a combination of these.

The discharge system 25 generally includes the capacitor 73, for storing energy therein, and for delivering a pulse of an electrical potential across the electrodes 35 and 36, via the normally-opened switch 74. While only a single capacitor 73 is shown schematically, it will become apparent to those skilled in the art that there may be additional capacitors and inductors (not shown) to form a bank of such capacitors or a pulse forming network (PFN). A power supply 76 is generally connected in parallel with the capacitor 73, via a normally-opened switch 80 for charging it.

The switch 80 is closed so as to cause the power supply 76 to charge the capacitor 73. The switch 74 is opened during the closure time of the switch 80, so as to interrupt the current flow through the electrode assemblies 35 and 36, while the capacitor 73 is being charged. Once the capacitor 73 is sufficiently charged, the switch 80 is opened, and the switch 74 is closed, in order to cause the capacitor 73 to be discharged across the electrode 35 and 36 through the vapor cloud 23, and the stream of liquid, for causing the plasma to be formed, magnetically pinched or constrained in a substantially narrow, linear stable configuration along the channel 14.

While the two switches 74 and 80 are described in a simplified manner for coordinating the firing of the devices 12 and 25, it should be understood that computerized switching devices such as ignitions, thyratrons, or spark gaps can be utilized instead, and that they are opened and closed in a suitable recurring manner.

The plasma emits intense ultraviolet radiation upon the ionized gas molecules returning to their normal state, after one or more of their electrons have been removed or returned from higher energy levels. Upon the completion of the discharge of the capacitor 73, the switch 74 is opened, while the switch 80 is closed, in order to cause the capacitor 73 to be recharged, in preparation for a subsequent plasma forming operation.

While in the present invention, the plasma pinch is not embedded within a gas medium, it should be understood that, in a gas embedded configuration, a cold gaseous blanket surrounds and stabilizes the plasma pinch, and insulates it from the inner wall of the housing 40. When such a pinch is formed in the high-Z gas, its copious ultraviolet production provokes electrical conductivity in the surrounding gaseous blanket through photolytic excitation. A conducting sheath may therefor form around the pinch, and may detract from its ohmic heating rate. At high densities any of these materials may become optically dense, thereby radiating substantially as a blackbody.

The liquid stream guided plasma pinch is a convenient and a generally well-behaved tool for investigating diffuse-discharge phenomena. High-Z gases in the pressure range of 0.02–2.00 atmospheres, generally cause the pinched plasma to be in a thermodynamic equilibrium as well as an efficient source of vacuum ultraviolet radiation As a "windowless" source of ultraviolet radiation, the high-Z gas-embedded plasma pinch becomes a potent means of photolyzing surrounding gases. Thus, the plasma pinch system 10 can be employed as a switch, to control the electrical conductivity of the sheath formed around the pinch, as pertaining to the control of thermonuclear nuclear fusion devices and the pumping of photolytic lasers.

Inductive electrical energy storage is presently being projected as an alternative to the traditional capacitor bank for high-energy systems. Generally, a ten to one hundred-fold increase in stored energy density may be realized by the inductive electrical storage technology. In order to achieve such an advance, a significant development in repetition-rate opening switch technology is needed, so as to enable the extraction of energy from the storage inductor.

Analyses of the inductive switch problems have identified the diffuse electrical gas discharge as a plausible current control medium. Conduction may be provoked through ionization induced by an external source of radiation. If the electrical fields and gas kinetics are appropriate for inhibiting the formation of an arc, then the current flow would be controlled by the external ionizing source. Opening the switch is accomplished by lowering the ionization via the source and/or through a shift and attachment kinetics. Repetitive pulse operation is facilitated by flushing the current-control medium with fresh gas for subsequent cycles.

Switches based on the foregoing technology can be rendered generally practical when each individual process in the sequence can be accomplished efficiently. A substantially viable sequence is the externally-controlled production of ionization. In general, laser beam, X-ray, and electron beam sources are substantially limited in efficiency. Further, many embodiments of switches based on these generators are stymied by window transmission and life limitations as well as repetition-rate cooling issues.

A high-density, high-Z gas-embedded plasma pinch can be a potent source of vacuum-ultraviolet radiation. Furthermore, the pinch photolytically induces electrical conductivity in an extended annular sheath surrounding the pinch. Thus, the gas-embedded pinch is an attractive alternative source of photoionization for diffuse-discharge opening switches.

Several desirable features are associated with the use of the pinch as a switch. Since the gas-embedded pinch radiates substantially like a blackbody, it can become an efficient source of vacuum ultraviolet energy. Moreover, the pinch is defined or guided by the stream, and does not require a material window. The pinch simply shares a portion of the photolyzed volume.

The foregoing considerations suggest that a high-Z gas-embedded plasma pinch can have applications both in the control of the fuse-discharge switches, and in the photolytic excitation of lasers. The cold gaseous sheath surrounding the plasma pinch damps instabilities, and consequently optimizes the use of the plasma pinch device as a stable source of ultraviolet radiation.

The diffuse-discharge kinetics are of considerable interest with regard to opening switch concepts and discharge-excited lasers. Coupling may be made via photolytic processes, and an interposed window may be avoided by exploiting magnetic forces. The following presentation will describe a stationary or equilibrium gas-embedded pinch model, followed by a kinetic pinch model and a bleach wave model.

EQUILIBRIUM GAS-EMBEDDED PINCH

Unlike conventional pinches, where a high-voltage breakdown establishes the initial current flow near the outer insulating wall of a cylindrical chamber, and then proceeds to ionize and to compress the rest of the gas toward the chamber axis, the gas-embedded pinch of the present invention utilizes a separate preionizing fine jet of liquid (about 100 micro-meters) to establish a central narrow conduction stream 22 about the axis of the chamber, prior to the application of the discharge voltage of 30,000 volts.

When the main driver such as the fast liquid stream is applied, the discharged electrical current flows in a predetermined pat therealong, rather than along the outer periphery of the chamber 16. The sheath of dense, cold gas that remains in contact with the hot stream 22 provides an effective inertial damper on the growth of kink instabilities, while thermal conduction losses from the pinch to its surroundings are kept adequately low.

Analyses of the relation between plasma pressure and density, pinch radius, and current profile, may involve some assumptions concerning the conservation of energy and mass. The rate of increase of energy in the fusion pinch is assumed to be equal to the difference between the resistive heating and the bremsstrahlung radiation loss, with contributions from the conduction and line radiation being relatively minimal. Another assumption is that the plasma pinch is optically thin. If such assumptions were not made, the bremsstrahlung loss rate would have to be corrected for self-absorption, and in the limit, it would evolve into blackbody radiation.

In analyzing a high-Z diffuse-discharge pinch, a person skilled in the art generally encounters parameter constraints that make the assumption of optical thickness of the pinch relatively plausible. The medium itself is not hydrogenic, even when ionized, and as such, a large number of highly absorbing lines will be involved. Furthermore, as it will become apparent in the following description, the optimum radius of the pinch for this application is more than an order greater than that of the fusion pinch.

Assuming that the energy per unit length of pinch is added by classical joule heating and lost by surface graybody radiation with emissivity $\epsilon$, one obtains the following quantitative relations between plasma parameters, electrical parameters, and system dimensions:

$$\frac{d}{dt}(\pi r^2 nkT) = I^2 R - 2\pi r \sigma T^4 \epsilon \qquad (1)$$

Where R is the resistance per unit length. R is assumed to be the classical Spitzer resistivity divided by the column cross section, thus:

$$R \simeq 125/\pi r^2 T^{3/2} \qquad (2)$$

It is assumed that the temperature is relatively low for this application and the ionic charge $Z \approx 1$.

It can be safely assumed that the effective plasma temperature in the left side of equation (1) is the same for ions and electrons, since equipartition times under present conditions, are very short compared to the discharge duration. The density n is the sum of electron and ion densities, and it is assumed to be twice the filling density of the cold gas. If the radius r is taken to be constant, equation (1) becomes:

$$\frac{dT}{dt} = C_1 \frac{I^2 T^{-3/2}}{nr^4} - C_2 \frac{T^4}{nr}\epsilon \qquad (3)$$

where, in mks units and T in °K:

$$C_1 = 9 \times 10^{23},$$
$$C_2 = 8 \times 10^{15}.$$

The momentum conservation and the assumption of radial quasi-equilibrium (negligible inertial forces) yield an equation of balance between plasma and magnetic pressures:

$$\frac{B_\theta^2}{2\mu_o} = nkT. \qquad (4)$$

Since:

$$B_\theta = \mu_o I/2\pi r$$

equation (4), becomes the well-known Bennett relation for pinches:

$$I^2 = C_3 n r^2 T \qquad (5)$$

where in mks units:

$$C_3 = 9 \times 10^{-16}.$$

Equations (3) and (5) still allow for change of T while r is constant. If however, steady-state conditions are assumed, equation (3) becomes:

$$I^2 = \frac{\epsilon C_2}{C_1} \cdot r^3 T^{11/2} \qquad (6)$$

which, when combined with equation (5) to eliminate $I^2$, becomes:

$$T^{9/2} = \frac{C_1 C_3}{\epsilon C_2} \cdot \frac{n}{r}. \qquad (7)$$

Assuming that n is not a variable, one obtains:

$$T \sim r^{-2/9}. \qquad (8)$$

By substantiating the value of T in equations (5) and (6), I becomes:

$$I \sim r^{8/9}. \qquad (9)$$

The relation between the discharge resistance R and the radius r is obtained from equations (2), (8), and (9), as follows:

$$R \sim r^{-13/9}. \qquad (10)$$

The power P scales as:

$$P \sim r^{\frac{1}{3}}, \qquad (11)$$

while the axial electrical field becomes:

$$E \sim r^{-5/9}. \tag{12}$$

Thus, a thicker pinch results in lower temperature, slightly higher total power, lower resistance, and lower voltage.

For photolytic applications, the radius will tend, in the first place, to be limited by considerations other than the above scaling. Most important is the time required for kink instabilities to disrupt the column. While it would seem reasonable to rely on the damping supplied by the surrounding gas, such damping is produced in part by the transfer of momentum of the kinking column to external shock waves, which could have harmful effects on the gas medium. Thus, the undamped kink growth rate should not displace the column by more than its own radius in the required radiating time.

It is easily shown that this growth time, for a "high $\beta$" plasma pinch, is just the ion sonic transit time over a radius. Thus, the growth time is:

$$\tau \sim r/\sqrt{T},$$

which, from equation (8), becomes:

$$\tau \sim r^{10/9}. \tag{13}$$

A large radius is clearly beneficial.

The assumption of steady state cannot be used during the heating phase of the pinch, and so, T(t) and I (t) will now be examined by combining equations (3) and (5). Eliminating I, one obtains:

$$\frac{dT}{dt} = \frac{C_1 C_3 T^{-1/2}}{r^2} - \frac{\epsilon C_2 T^4}{nr}, \tag{14}$$

or:

$$\frac{dT}{dt} + FT^{-1/2} - GT^4, \tag{15}$$

where the radius is constant, and where:

$$F = C_1 C_3 / r^2,$$
$$\text{and } G = \epsilon C_2 / nr$$

are constants for a constant radium pinch. For the following parameters:

$$r = 3 \times 10^{-3} m, \; n = 6 \times 10^{24} m^{-3}, \text{ and } \epsilon \sim 1,$$
$$F = 9 \times 10^{13}, \text{ and}$$
$$G = 4 \times 10^{-7},$$

a numerical solution of equation 15 is shown in FIG. 2, both for T(t) and I(t), obtained by invoking the Bennett relation of equation (5). For both T(t) and I(t), a nearly infinite rate of rise is required when T is near zero, and this ideal situation cannot be met, due to the limitation at $t=0$, to $dI/dt = V_oL$, where $V_o$ is the line voltage, and L is the discharge inductance. However, an approximation to the ideal situation may be achieved by making the actual current rise time, $L/(Z_o+R)$, equal to about 20 ns, which is that of the idealized I(t).

For a pinch 30 cm long, having $r=3$mm, and the outer current return radius 5 cm, $L=170$nh, so that $R+Z_o=8.5$ ohms. For efficient excitation the pulse-line electrical driver should also have an impedance of about 8 ohms. The pulse-line voltage would then be 320 kV to bring the discharge current asymptotically to 30 kA.

KINETIC PINCH MODEL

The foregoing analytical solution for the discharge developed pertains to a special set of circumstances. It is useful in guiding experimental designs, as well as in formulating a more complete and more general model. To develop such a model in which the radius varies, involves a reconsideration of the equation relating to the conservation of energy:

$$dE = d[pV/(\gamma-1)] = d[nkT/(\gamma-1)], \tag{16}$$

where n is the number of particles. The B fields in the magnetized plasma reduce the number of degrees of freedom and the specific heat $\gamma$ is approximately 2, rather than the customary 5/3. Consequently, by differentiating both sides of the equation (16) with respect to time, one obtains:

$$\frac{dE}{dt} = \frac{d}{dt}(\pi r^2 nkT) = I^2 R - 2\pi r \sigma T^4 \epsilon. \tag{17}$$

Departing now into a kinetic model requires invoking momentum balance.

First, one notes that there is an outward pressure nkT tending to expand the pinch. The magnetic pressure resulting from the current flow I acts inward to compress the column. Therefore, $$\frac{d^2 r}{dt^2} = \frac{2kT}{m_i r} - \frac{\mu_o I^2}{4\pi r} \cdot \frac{1}{Nm_i}, \tag{18}$$

where $m_i$ is the ion mass and $N = \pi r^2 n$ is the line density. Rewriting equations (17) and (18), yields the following equations:

$$\frac{dT}{dt} = \frac{125}{2\pi k} \cdot \frac{I^2 T^{-3/2}}{Nr^2} - \frac{\pi \sigma \epsilon}{k} \cdot \frac{T^4}{N} - \frac{2T}{r} \frac{dr}{dt}, \tag{19}$$

$$\frac{d^2 r}{dt^2} = \frac{kT}{m_i r} - \frac{\mu_o I^2}{2\pi r} \frac{1}{Nm_i}. \tag{20}$$

As indicated in FIG. 3, the behavior is analyzed with a computer code for a current source 100, having a load 102. Its temporal dependence is assumed to be:

$$I(t) = I_o(1 - e^{t/\tau}). \tag{21}$$

The set of equations (19), (20) and (21) is solved with an explicit one and one-half step integration technique. In this approach, the derivative is computed twice for each step, at each step and one half step, in order to obtain a high order of accuracy.

$T_1$, $r_1$, and $V_1$ being the initial values of temperature, radius, and velocity, the integration for 1,000 steps, each $\Delta t$ apart, is performed with the equations:

$$T_n + 1/2 = \frac{dT}{dt}\bigg|_n \cdot \frac{\Delta t}{2} + T_n,$$

-continued $$r_{n+1/2} = V1n \cdot \frac{\Delta t}{2} + r_n,$$

$$V_{n+1/2} = \frac{dV}{dt}\bigg|_n \cdot \frac{\Delta t}{2} + V_n,$$

$$T_{n+1} = \frac{dT}{dt}\bigg|_{n+1/2} \cdot (\Delta t) + T_n,$$

$$r_{n+1} = V_{n+1/2} \cdot (\Delta t) + r_n,$$

$$V_{n+1} = V_{n+1/2} \cdot (\Delta t) + V_n, \text{ and}$$

$$t = (n-1) \cdot \Delta t, n = 1, 2, 3, \ldots$$

Once the temperature history is generated, it is stored in a file and retrieved by another code that computes the power density from a given spectral band as a function of time. Each temperature is used as a constant in the Planck radiation low which is integrated by Simpson's rule. Each sum is stored as part of the power history of the pinch and ultimately plotted.

FIGS. 4, 5, 6 and 7 illustrate the computed results for a range of initial conditions. Temperatures of tens of kilodegrees are predicted indicating the potential of the high-Z pinch as an intense vacuum ultraviolet source. The current is given by "x", and the temperature by "Δ".

Figure 8:
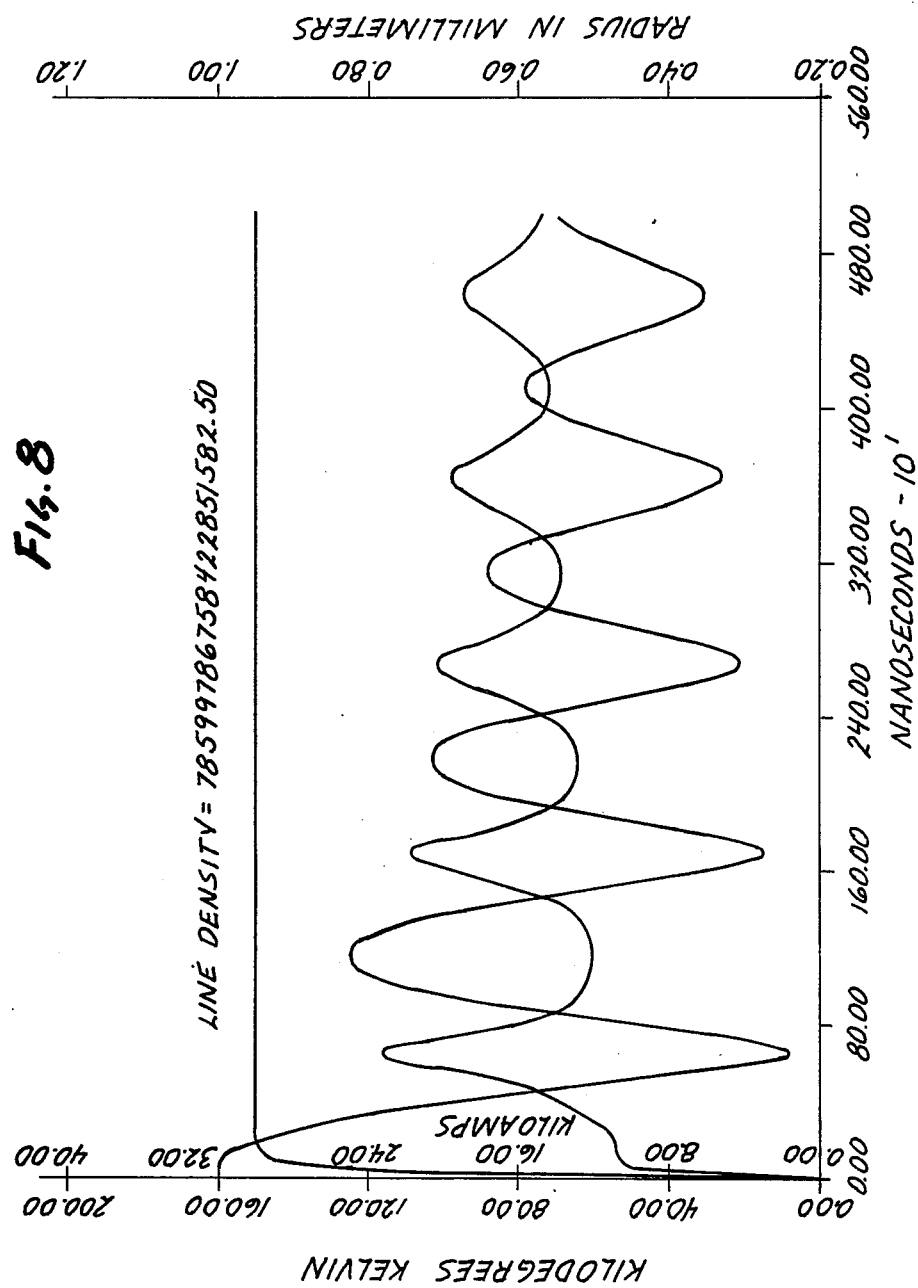
FIG. 8 is a graphical representation of the computed behavior of a 1 mm plasma pinch in argon at about 1 atmosphere.
Figure 9:
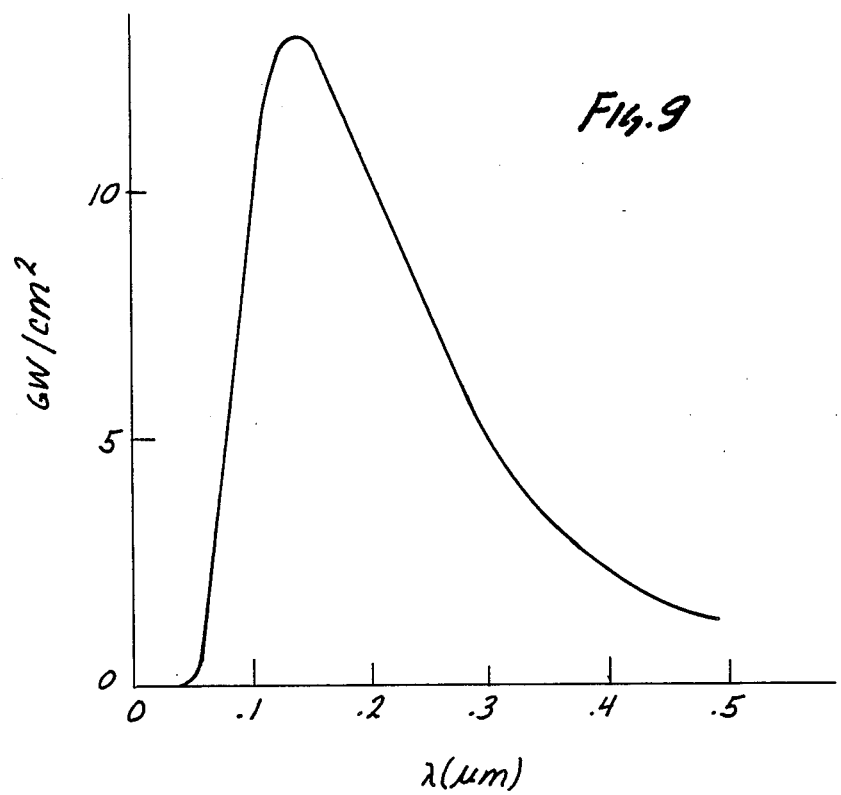
FIG. 9 is a graphical representation of a typical spectical power spectrum for a blackbody at about 20,000° K. to better understand the system of the present invention.

FIG. 8 incorporates an additional dashed curve indicating the temperature as computed by the LANL Global MHD Model. This model assumes that the plasma channel is optically thin. Consequently, even though it is a vastly more sophisticated code, its result may be no more valid than the present prediction in the case of the high-Z gas argon. This lends confidence to the utilization of the present simple code for guiding in the design of experiments, and in inexpensively and rapidly surveying a broad range of diffuse-discharge phenomena in high-Z gases.

While a particular embodiment of the present invention has been disclosed, it is to be understood that various different modifications are possible and are contemplated within the true spirit and scope of the appended claims. There is no intention, therefore, of limitations to the exact abstract or disclosure herein presented.

What is claimed is:

1. A method of generating a plasma pinch, comprising:

using a pair of spaced apart combination liquid emitter and electrode means, and combination liquid receptor and electrode means;

flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid;

establishing an electrical voltage potential difference between said electrode means of a sufficient high voltage to cause electrical current to flow through said liquid vapor cloud for establishing initially a low density plasma therealong sufficient to emanate energy therefrom to said flowing liquid stream to heat it sufficiently to cause it to become ionized and to be converted into a high density plasma in response to said low density plasma.

2. A method according to claim 1, further including charging and discharging capacitor means for pulsating said current flow.

3. A method according to claim 2, wherein said fluid is selected from the group consisting of water, decane and pentane.

4. A method according to claim 1, wherein said liquid is an electrically conductive liquid.

5. A method according to claim 1, wherein the flowing fine stream of fluid is less than about approximately 100 μm in diameter.

6. A method according to claim 1, wherein said combination liquid emitter and electrode means and combination liquid receptor and electrode means each includes:

an inner tube composed of electrically conductive material to permit electric current to flow therethrough;

means connected in fluid communication with said inner tube for permitting liquid communication between the inner tube and the stream of liquid; and an outer tubular element having nozzle means connected in fluid communication with said tube.

7. A method according to claim 6 wherein said combination liquid emitter and electrode means including a first assembly connected in fluid communication with said liquid under pressure, said first assembly having a front and rear portion, said front portion being disposed in an opening in said vacuum chamber, a first central bore with a first plastic tube disposed therein for permitting fluid communication between the first plastic tube and the source of said liquid under pressure, and a first metallic electrode tube co-axially aligned with said plastic tube for permitting electric current to flow along said first metallic electrode tube and through said fluid as it is discharged from said front portion and into said vacuum chamber; and said combination liquid collectors and electrode means including a second assembly, said second assembly including an inlet and outlet portion, said inlet portion being disposed in an opening in said vacuum chamber and in confronting oppositely spaced, co-axial alignment with said nozzle means to permit substantially most of the liquid particles of said stream of fluid to be captured therein, a second central bore with a second plastic tube disposed therein for permitting fluid communication between the second plastic tube and said outlet portion, a second metallic electrode tube co-axially aligned with said second plastic tube, said second metallic electrode tube permitting electric current to flow therealong and through said liquid.

8. A method according to claim 1, wherein said electrical current flow is pulsated repetitively at a rate less than about once per second.

9. A method according to claim 8, wherein said electrical current flow is pulsated repetitively at a rate of between substantially once per second and substantially ten times per second.

10. A method according to claim 9, wherein said current flow is pulsated repetitively at a rate of ten times per second; and wherein said fluid is selected from the group consisting of water, decane, pentane, mercury, and gallium.

11. A method of generating a plasma pinch comprising:

establishing a plasma source including a tenuous vapor preconditioning cloud surrounding a flowing fine stream of fluid under pressure;

supplying an electrical current flow to said vapor cloud for establishing a low density plasma therealong;

causing said stream of fluid to be converted to a high density plasma in response to said low density plasma;

charging and discharging capacitor means for pulsating said current flow;

wherein said fluid is selected from the group consisting of water, decane and pentane.

12. A method according to claim 11, further including:

using a vacuum chamber;

directing the fine stream of fluid under pressure through the interior of the vacuum chamber;

charging and discharging a capacitor means for pulsating said current flow; and wherein said fluid is selected from the group consisting of water, decane and pentane.

* * * * *

UNITED STATES PATENT AND TRADEMARK OFFICE
Certificate

Patent No. 4,889,605                                                          Patented: December 26, 1989

On petition requesting issuance of a certificate for correction of inventorship pursuant to 35 U.S.C. 256, it has been found that the above-identified patent, through error and without any deceptive intent, improperly sets forth the inventorship. Accordingly, it is hereby certified that the correct inventorship of this patent is:
John F. Asmus, Ralph H. Lovberg and Keith Boyer.

Signed and Sealed this 14th Day of August 1990.

BRIAN E. HEARN

*Supervisory Patent Examiner*
                                                        *Patent Examining Group 110*

UNITED STATES PATENT AND TRADEMARK OFFICE
CERTIFICATE OF CORRECTION

PATENT NO. : 4,889,605

DATED : December 26, 1989

INVENTOR(S) : John F. Asmus, et al.

It is certified that error appears in the above-identified patent and that said Letters Patent is hereby corrected as shown below:

In the Title: after "system", insert -- AND METHOD OF USING SAME--.

Column 8, line 4, after "radiation", please insert --.--.

Column 9, line 18, after "predetermined", delete "pat", and substitute therefor --path--.

Signed and Sealed this

Sixth Day of August, 1991

Attest:

HARRY F. MANBECK, JR.

Attesting Officer

Commissioner of Patents and Trademarks